United States Patent
Ishihara et al.

(10) Patent No.: US 7,579,287 B2
(45) Date of Patent: Aug. 25, 2009

(54) SURFACE TREATMENT METHOD, MANUFACTURING METHOD OF SEMICONDUCTOR DEVICE, AND MANUFACTURING METHOD OF CAPACITIVE ELEMENT

(75) Inventors: Shigenori Ishihara, Moriya (JP); Nobuo Kawase, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 184 days.

(21) Appl. No.: 11/501,005

(22) Filed: Aug. 9, 2006

(65) Prior Publication Data

US 2007/0037413 A1 Feb. 15, 2007

(30) Foreign Application Priority Data

Aug. 12, 2005 (JP) ............................. 2005-235096
Feb. 21, 2006 (JP) ............................. 2006-043967

(51) Int. Cl.
H01L 21/00 (2006.01)
(52) U.S. Cl. ................ 438/795; 438/798; 257/E21.077
(58) Field of Classification Search ................ 438/792, 438/795, 798, 75, 776
See application file for complete search history.

(56) References Cited

U.S. PATENT DOCUMENTS

| | | | | |
|---|---|---|---|---|
| 5,909,627 | A | 6/1999 | Egloff | 438/406 |
| 6,025,280 | A | 2/2000 | Brady et al. | 438/762 |
| 6,025,281 | A | 2/2000 | Passlack et al. | 438/779 |
| 6,281,138 | B1 | 8/2001 | Brady et al. | 438/762 |
| 6,328,801 | B1* | 12/2001 | Gary et al. | 118/688 |
| 6,342,446 | B1 | 1/2002 | Smith et al. | 438/687 |
| 6,497,783 | B1 | 12/2002 | Suzuki et al. | 156/345 |
| 6,653,554 | B2 | 11/2003 | Ishihara | 136/258 |
| 6,833,575 | B2 | 12/2004 | Parekh et al. | 257/296 |
| 6,844,258 | B1* | 1/2005 | Fair et al. | 438/648 |
| 7,141,756 | B2 | 11/2006 | Ohmi et al. | 219/121.43 |
| 7,226,848 | B2 | 6/2007 | Sugawara et al. | 438/475 |
| 2002/0158250 | A1* | 10/2002 | Fujisaki et al. | 257/64 |
| 2006/0194417 | A1 | 8/2006 | Ishihara et al. | 438/479 |
| 2006/0225775 | A1 | 10/2006 | Ishihara | 136/244 |

FOREIGN PATENT DOCUMENTS

| | | |
|---|---|---|
| JP | 5-213604 | 8/1993 |
| JP | 9-106974 | 4/1997 |
| JP | 11-40397 | 2/1999 |
| JP | 11-260913 | 9/1999 |
| JP | 2002-299241 | 10/2002 |
| JP | 2003-224266 | 8/2003 |
| WO | 03/056622 | 7/2003 |

OTHER PUBLICATIONS

Official Action dated Nov. 25, 2008 in Japanese Application No. 2006-211055.

* cited by examiner

*Primary Examiner*—Phat X Cao
*Assistant Examiner*—Nga Doan
(74) *Attorney, Agent, or Firm*—Fitzpatrick, Cella, Harper & Scinto

(57) ABSTRACT

A method for processing an object containing moisture is provided to efficiently remove the moisture and to prevent re-adsorption of the moisture. In particular, the method has a step of removing the moisture contained in the object in an atmosphere containing excited hydrogen, deuterium, deuterated hydrogen, or tritium.

12 Claims, 8 Drawing Sheets

SURFACE TREATMENT METHOD, MANUFACTURING METHOD OF SEMICONDUCTOR DEVICE, AND MANUFACTURING METHOD OF CAPACITIVE ELEMENT

BACKGROUND OF THE INVENTION

1. Field of the Invention

The present invention relates to a surface treatment method, a manufacturing method of a semiconductor device, and a manufacturing method of a capacitive element, and more particularly, relates to a manufacturing method of a capacitive element and a manufacturing method of a MOS transistor, a CCD, a TFT, an SOI substrate, an inkjet head, and the like.

2. Description of the Related Art

A semiconductor device is manufactured by sequentially performing various treatment processes for a substrate such as silicon, sapphire, or glass. The treatment processes mentioned above include, for example, cleaning, oxidation, thin-film formation, dopant doping, and etching.

Treatment apparatuses used for various treatment processes are disposed in a clean room, and all the treatment processes are performed in the clean room. During the treatment processes, a semiconductor substrate is exposed to a clean room atmosphere when it is transferred from one process to the following process. In general, when a solid material is exposed to a clean-room atmosphere, moisture therein simultaneously adsorbs on surfaces of the solid material. Moisture (adsorption moisture) which adsorbs on a semiconductor-surface causes, for example, the following adverse influences (1) to (4).

(1) Adsorption moisture itself desorbs in a subsequent step in the form of water vapor and exists as an impurity in the process atmosphere.

(2) Adsorption moisture which adsorbs on a silicon substrate forms a native oxide film thereon when oxygen is present in that atmosphere. For example, when a silicon nitride film is formed on the substrate, the native oxide film thus formed has an adverse influence on the control of quality and uniformity of the film to be grown. In addition, when the above native oxide film is present in the vicinity of a transistor gate, the threshold value and the breakdown voltage of the transistor are varied. Furthermore, on a capacitor electrode of a semiconductor device, electric charges are liable not to be stored.

(3) In a wiring process of a semiconductor device, in order to prevent spikes due to the formation of tungsten silicide, a TiN (titanium nitride) film is formed before a tungsten (W) film is formed. However, when adsorption moisture is present on a semiconductor substrate surface used as an underlying layer, the adhesion of the TiN film is degraded.

(4) When oxidation occurs at connection portions of metal wires of a semiconductor device due to the presence of adsorption moisture, a metal oxide is formed, and as a result, conduction between the metal wires may be blocked, or the connection resistance may be increased in some cases.

As described above, since adsorption moisture has caused various adverse influences, it is required to remove moisture present on a semiconductor substrate surface in every process.

Accordingly, a method has been performed in which a substrate with moisture adsorbed thereon is heated to a high temperature, such as approximately 300° C., to remove the moisture. In addition, a method of irradiation of a noble gas or a hydrogen active species has also been proposed (see Japanese Patent Laid-Open No. 11-260913).

In addition, a method has also been proposed in which moisture is removed by using a water-decomposing gas, that is, a gas reactive with water (see Japanese Patent Laid-Open No. 5-213604).

Furthermore, a method has also been proposed in which a water-soluble gas, that is, a gas having water absorbing properties, is brought into contact with a substrate surface to remove moisture (see Japanese Patent Laid-Open No. 9-106974). In this method, as a gas having water-absorbing properties, for example, hydrogen chloride, hydrogen bromide, and ammonia may be mentioned.

However, the moisture removal by heating and the techniques described in the above cited literatures have various problems to be solved.

For example, according to the above-described techniques, only adsorption moisture present on the topmost surface of a semiconductor substrate can be removed, and in addition, when the semiconductor substrate is again exposed to the atmosphere, a predetermined amount of moisture again adsorbs on the surface of the semiconductor substrate. In particular, it is difficult to prevent re-adsorption of moisture released from the rear surface of the substrate, the moisture being difficult to remove by moisture removal treatment.

In addition, when a water-decomposing gas or a gas having water absorbing properties is used, special treatment and consideration are required for plumbing materials and safety measures. In other words, since these gases have strong toxicity, acidity, or alkalinity, the handling thereof must be performed in a specific manner, and as a result, the increase in facility cost may occur in some cases.

Furthermore, hydrogen chloride, hydrogen bromide, and ammonium gases are strongly corrosive, and depending on a surface material of an object (semiconductor substrate), the surface thereof may be etched in some cases.

In the case of a thin film transistor (TFT), as the surface area of a substrate is increased, the distortion thereof is also increased when adsorption moisture is removed by heating as described above. In addition, when the heating temperature is decreased, it will take a longer time to remove adsorption moisture.

When adsorption moisture on a semiconductor substrate is removed by heat treatment at a high temperature, the profile of impurities is changed, and as a result, it becomes difficult to obtain a predetermined device performance. That is, an impurity such as arsenic (As) or phosphorous (P) forming an $n^+$ layer or boron (B) forming a $p^+$ layer is unfavorably diffused by heat.

Incidentally, as a technique used for forming a gate insulating film of a transistor, there has been a nitridation treatment of a substrate surface (see Japanese Patent Laid-Open No. 11-40397).

In a state-of-the-art transistor, it has been desired that a thin film nitride having a desired thickness be formed on the surface of a semiconductor substrate.

However, since nitridation does not proceed as expected, it has been difficult to obtain a nitride film having a desired thickness. In addition, by the nitridation treatment, the properties of the semiconductor substrate were changed in some cases.

The difficulties of forming the nitride film and the changes in properties of the object described above are problems to be solved by a general surface treatment method used not only for semiconductor device applications but also for other applications.

SUMMARY OF THE INVENTION

The present invention is directed to a surface treatment method capable of obtaining a nitride film having a desired thickness and a method for manufacturing a semiconductor device.

The present invention is also directed to a surface treatment method capable of suppressing the change in properties of an object and a method for manufacturing a semiconductor device.

The present invention is further directed to a surface treatment method capable of efficiently removing adsorption moisture and also of suppressing re-adsorption of moisture and a method for manufacturing a semiconductor device.

In accordance with one aspect of the present invention, there is provided a surface treatment method which comprises a surface treatment step of exposing a surface of an object to an atmosphere containing at least one selected from the group consisting of hydrogen (H), deuterium (D), deuterated hydrogen (HD), and tritium (T), and a nitridation step of nitriding the surface of the object after the surface treatment step.

In accordance with another aspect of the present invention, there is provided a method for manufacturing a semiconductor device, which comprises a surface treatment step of exposing a surface of a semiconductor substrate to an atmosphere containing at least one selected from the group consisting of hydrogen, deuterium, deuterated hydrogen, and tritium, a step of forming a gate insulating film after the surface treatment step, which comprises a nitridation substep of nitriding the surface of the semiconductor substrate, and a step of forming a gate electrode on the gate insulating film.

In accordance with another aspect of the present invention, there is provided a method for manufacturing a capacitive element, which comprises a surface treatment step of exposing a surface of a lower electrode to an atmosphere containing at least one selected from the group consisting of hydrogen, deuterium, deuterated hydrogen, and tritium, a nitridation step of nitriding the surface of the lower electrode after the surface treatment step to form an insulating film, and a step of forming an upper electrode on the insulating film.

In accordance with another aspect of the present invention, there is provided a capacitive element manufactured by the above manufacturing method.

Furthermore, in accordance with another aspect of the present invention, there is provided a surface treatment method for performing hydrophobic treatment on a surface of an object, which comprises a surface treatment step of exposing the surface of the object to an atmosphere containing at least one selected from the group consisting of deuterium, deuterated hydrogen, and tritium so as to perform the hydrophobic treatment.

The concentrations of the deuterium, deuterated hydrogen, and tritium used in the present invention are necessarily higher than the concentrations of those naturally present on the earth. For example, the concentration of deuterium is required to be sufficiently higher than the concentration (0.016%) of that present on the earth.

According to the present invention, a nitride film having a desired thickness can be obtained. In addition, the change in properties of the object can be suppressed.

Furthermore, according to the present invention, adsorption moisture can be efficiently removed, and in addition, re-adsorption of moisture can be suppressed.

Further features of the present invention will become apparent from the following description of exemplary embodiments with reference to the attached drawings.

DETAILED DESCRIPTION OF THE EMBODIMENTS

A surface treatment method of one embodiment according to the present invention comprises: (1) a surface treatment step of exposing a surface of an object to an atmosphere containing at least one selected from the group consisting of hydrogen, deuterium, deuterated hydrogen, and tritium; and (2) a nitridation step of nitriding the surface of the object after the surface treatment step.

Figure 1:
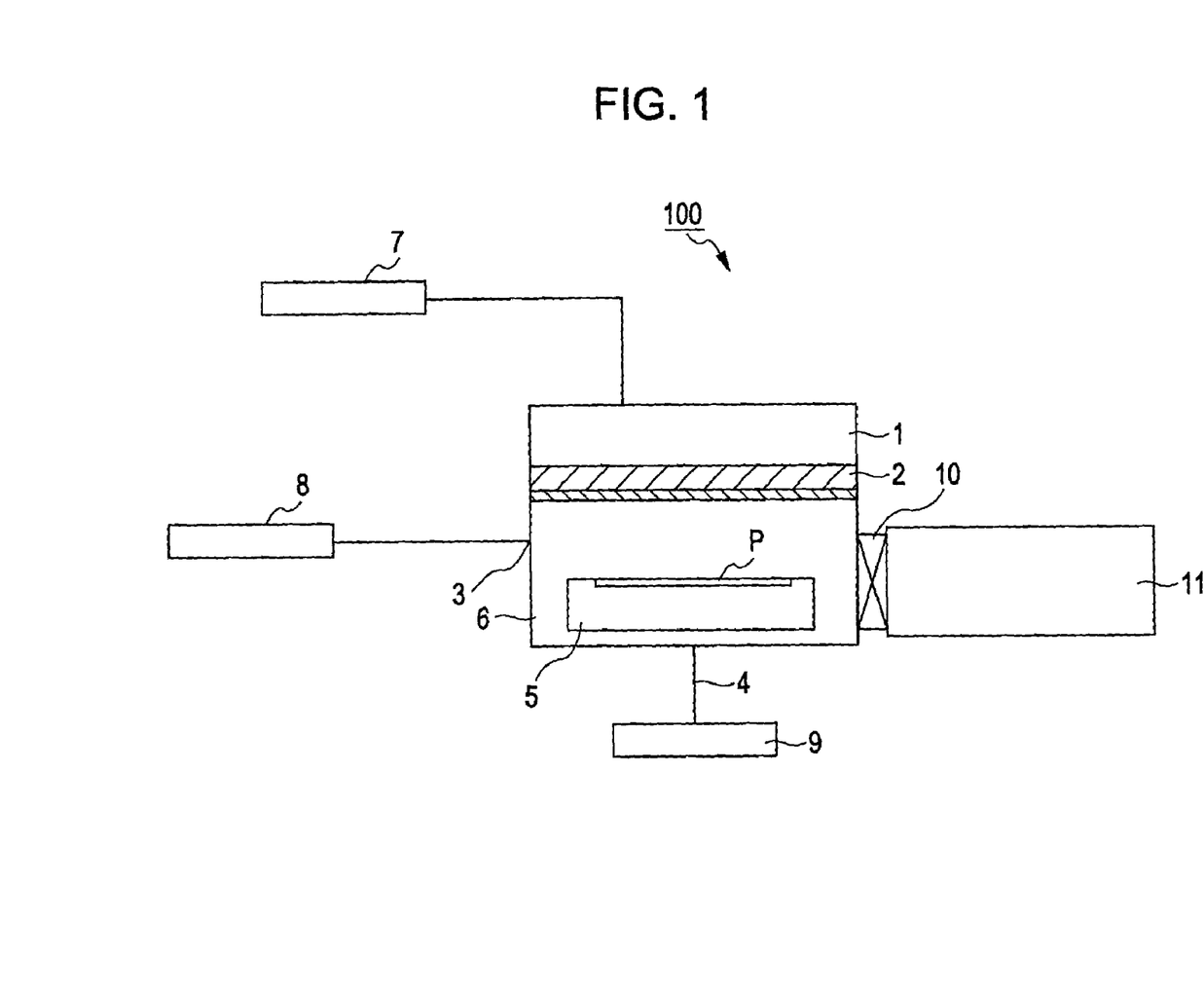
FIG. 1 is a schematic cross-sectional view showing one example of a treatment apparatus performing a treatment method according to the present invention.

FIG. 1 is a cross-sectional view of one example of a treatment apparatus 100 for performing a surface treatment method according to the present invention.

The treatment apparatus 100 includes two air-tight chambers. That is, one is a vacuum process chamber 6 receiving a substrate P, and the other one is a vacuum load lock chamber 11 connected to the front side of the process chamber 6.

Between the process chamber 6 and the load lock chamber 11, a gate valve 10 is provided so that the inside atmospheres thereof are isolated from each other.

The substrate P as the object is transferred into the load lock chamber 11 at an atmospheric pressure by transfer means (not shown). In this transfer, the substrate P is transferred into the load lock chamber 11 from a carrier cassette or the like containing the substrate P through access means such as an atmospheric-side gate valve which is not shown. In addition, during the transfer, the gate valve 10 between the process chamber 6 and the load lock chamber 11 is closed, and the pressure inside the process chamber 6 is decreased, for example, to approximately $1 \times 10^{-3}$ Pa.

Subsequently, the load lock chamber 11 which contains the substrate P is air-tightly closed and is then evacuated to a predetermined pressure by evacuation means such as a vacuum pump (not shown). Next, the substrate P is transferred into the process chamber 6 through the opened gate valve 10 by vacuum transfer means (not shown).

The process chamber 6 has a gas introduction device 8, a gas inlet port 3, an exhaust pipe 4, an exhaust device 9, a heater stage 5 capable of heating the substrate P, a microwave generator 7, a microwave guide 1, and a microwave transmission window 2.

The gas introduction device 8 and the gas inlet port 3 supply a gas containing deuterium (D) used as a process gas into the process chamber 6 while the flow rate of the process gas is being controlled to a desired value.

However, as the process gas, besides deuterium, a hydrogen-based gas, such as hydrogen (H), deuterated hydrogen (HD), or tritium (T), may also be used, and in addition, a mixed gas may also be used containing at least two gases selected from the aforementioned hydrogen-based gases. Furthermore, a mixed gas may also be used which contains a gas selected from the aforementioned hydrogen-based gases and a noble gas such as helium, neon, argon, xenon, or krypton.

The exhaust pipe 4 discharges the process gas introduced into the process chamber 6 and reaction products formed by the surface treatment outside the process chamber 6.

The exhaust device 9 controls the inside pressure of the process chamber 6 to a desired value based on measurement data of a pressure sensor (not shown). The exhaust device 9 includes, for example, a conductance valve, a vacuum pump, and a shut valve.

A heater of the heater stage 5 is provided whenever necessary, and when being processed by this heater, the substrate P can be heated and can be controlled to a desired temperature. The heater stage 5 is controlled in this embodiment so that the temperature of the substrate P is set in the range of 180 to 400° C. and is preferably set in the range of 250 to 400° C. The temperature of the substrate can be measured, for example, by a thermocouple provided for the stage or a non-contact thermometer such as a radiation thermometer.

The microwave generator 7 excites a process gas and generates a microwave for plasma generation. In this embodiment, the process gas is excited to generate plasma in the process chamber 6 in which the substrate P is received, and the substrate surface is exposed to excited hydrogen, deuterium, deuterated hydrogen, or tritium, so that the surface treatment is performed. However, when a hydrogen-based gas is excited by using plasma discharge or a catalyst at a place apart from the process chamber 6 and is then introduced into the process chamber 6 for the substrate surface treatment, an effect similar to that described above can also be obtained.

As the excited hydrogen-based gas which can be used in the present invention, the following excited species may be mentioned. For example, there may be mentioned hydrogen radicals, hydrogen ions, atomic hydrogen, deuterium radicals, deuterium ions, atomic deuterium, deuterated hydrogen radicals, deuterated hydrogen ions, atomic deuterated hydrogen, tritium radicals, tritium ions, and atomic tritium.

The microwave guide 1 guides a microwave into the process chamber 6 through the microwave transmission window 2. The microwave transmission window 2 is formed of a dielectric material such as quartz glass or aluminum nitride.

The substrate P transferred into the process chamber 6 is placed on the heater stage 5 and is heated to a predetermined temperature. Furthermore, the substrate P is processed at a predetermined pressure by plasma of a process gas containing deuterium, which is excited by the microwave. The predetermined pressure is preferably in the range of 50 to 400 Pa.

In this embodiment, a single-wafer process type treatment apparatus provided with the load lock chamber 11 is used; however, the treatment apparatus is not limited thereto. For example, an atmospheric chamber structure may also be used in which the load lock chamber 11 is not provided and in which the process chamber 6 is directly communicated with the atmosphere when the gate valve is opened. Alternatively, a batch type treatment apparatus may be used in which a plurality of the substrates P is simultaneously processed in the process chamber 6.

In addition, in this embodiment, after the surface of the substrate P used as the object is exposed to the atmosphere containing at least one selected from the group consisting of hydrogen, deuterium, deuterated hydrogen, and tritium for the surface treatment, nitridation treatment is then performed for the substrate to nitride the surface thereof.

The state of the substrate before the nitridation treatment will be described with reference to experimental examples.

EXPERIMENTAL EXAMPLE 1

First, a sample was formed as described below. On a surface of a monocrystalline silicon substrate, an amorphous silicon oxide film having a thickness of 100 nm was formed by thermal oxidation, and on the film thus formed, an amorphous silicon (hereinafter referred to as "a-Si") film having a thickness of 400 nm was formed by a plasma CVD method. Subsequently, on the surface of the a-Si film thus formed, an amorphous silicon oxide having a thickness of 50 nm was formed by a plasma CVD method.

For the sample thus obtained, surface treatment was performed using the treatment apparatus 100 shown in FIG. 1.

While the temperature of the heater stage 5 receiving the sample was heated to 280° C., and deuterium ($D_2$) was supplied as a process gas, the pressure inside the process chamber 6 was controlled to 66.7 Pa using exhaust means 9.

While the conditions described above were maintained, a microwave having a wavelength of 2.45 GHz was generated at an output of 3 kW by the microwave generator 7. The microwave thus generated was introduced into the process chamber 6 through the microwave guide 1 and the microwave transmission window 2, so that deuterium plasma was generated.

While the conditions described above were maintained, the sample was processed with the deuterium plasma for 10 minutes.

In addition, a sample having the structure similar to that described above was prepared and was then processed in the same manner as that described above except that hydrogen ($H_2$) was used instead of deuterium.

Figure 2:
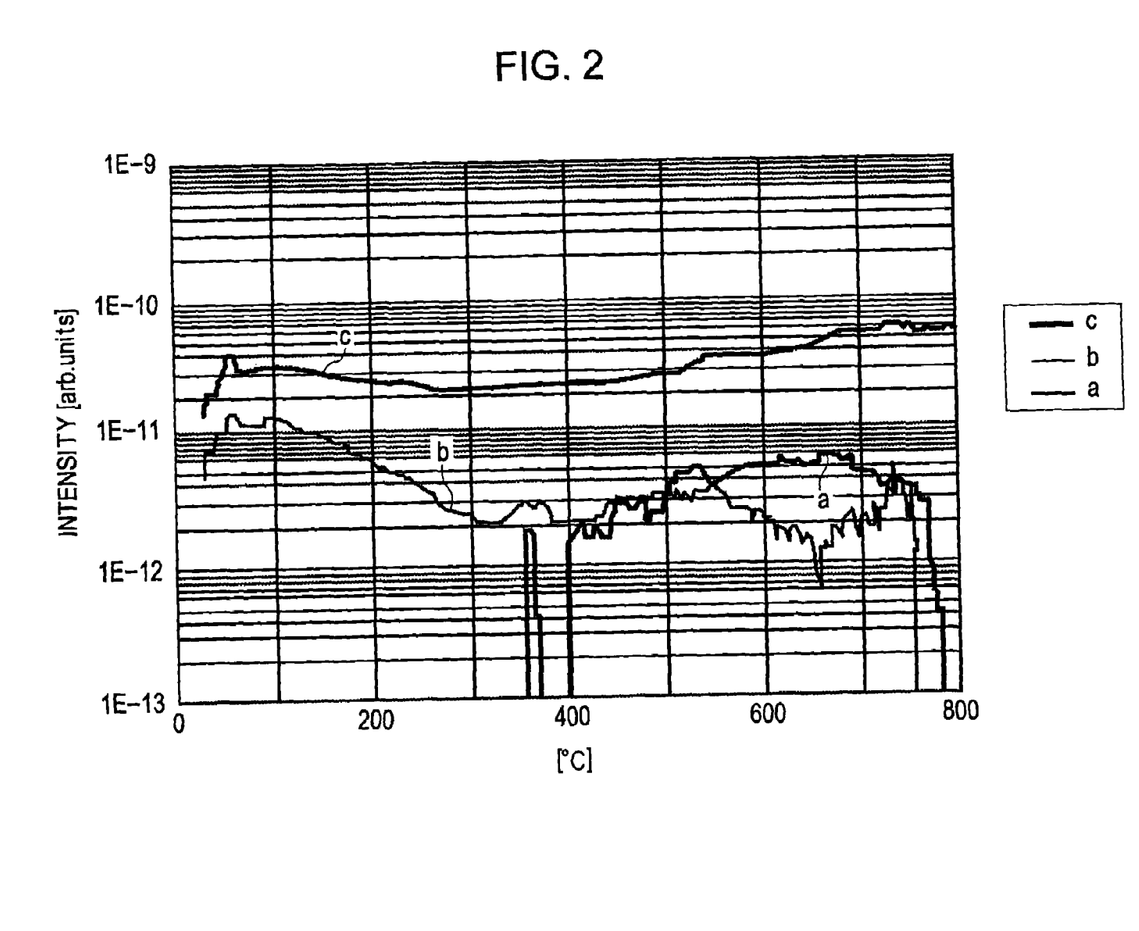
FIG. 2 is a graph showing the results of desorption of water molecules from an amorphous silicon substrate, which are obtained by an analysis using thermal desorption spectrometry (TDS).

FIG. 2 is a graph showing analytical results of three samples, that is, a sample A1 which was surface-treated with deuterium, a sample B1 which was surface-treated with hydrogen, and a sample C1 which was not surface-treated.

In this example, the above three samples were analyzed by thermal desorption spectrometry (TDS), and then the results of desorption of water molecules were compared with each other.

In FIG. 2, letter "a" indicates the result of the sample A1 which was surface-treated with $D_2$, letter "b" indicates the result of the sample B1 which was surface-treated with $H_2$, and letter "c" indicates the result of the sample C1 which was not surface-treated at all.

In the TDS analysis, the temperature of the sample was increased at a constant rate in a vacuum atmosphere, and gases desorbed from the sample were measured using a mass spectrometric apparatus. By this measurement, as for gas species having predetermined molecular weights, the temperature dependence of desorption amount (relative value) can be measured.

In FIG. 2, the measurement result of water molecules (molecular weight of 18) is shown.

In general, when the desorption data of water molecules (molecular weight of 18) is measured for a silicon-based material, the information is obtained which indicates that surface adsorption water is present at approximately 100° C., hydrogen-bonded water (occluded water) is present at approximately 300° C., and structural water (water produced by decomposition of a film) is present at 400° C. or more.

As apparent from the graph shown in FIG. 2, the data (b) of the sample B1 indicates a very small amount of desorption moisture at approximately 300° C. as compared to that shown in the data (c) of the non-treated sample C1. However, the peak can be observed at approximately 100° C., and hence it is believed that moisture again adsorbs on the surface which was previously processed by hydrogen plasma treatment.

In addition, as apparent from the data (a) of the sample A1, desorption of water is not observed at all from room temperature to approximately 300° C.

Accordingly, it was understood that in addition to effective removal of adsorption water and hydrogen-bonded water, deuterium plasma can also prevent re-adsorption of water to the sample surface.

Furthermore, the sample A1 showing the data (a) was left for 2 months in a clean-room atmosphere after the deuterium plasma treatment. Subsequently, when the amount of desorption water was again analyzed by TDS, the spectrum thus obtained was approximately similar to that obtained before. Accordingly, it was also understood that the above effect of preventing water adsorption lasts for a significantly long period of time.

When additional experiments were further performed, it was understood that for the surface treatment method of the present invention, the following conditions are preferable.

Hereinafter, preferable embodiments of the present invention will again be described.

When the temperature of the sample in the surface treatment step of the present invention is less than 180° C., it becomes difficult to remove hydrogen-bonded water. On the other hand, when the temperature is 400° C. or more, deuterium adsorbed on the sample is removed, and as a result, the effect of the dehydration treatment starts to be degraded. Hence, the temperature is preferably set to 180° C. to 400° C. Furthermore, when the temperature is 250° C. or more, the dehydration treatment can be efficiently performed.

In addition, the process pressure is preferably in the range of 50 Pa to 400 Pa.

When the process pressure is less than 50 Pa, an etching reaction of silicon (from Si to $SiD_4$) becomes apparent, and the influence thereof cannot be ignored. That is, deuterium ions having high energy and etching ability in plasma are liable to reach the substrate P. In addition, at a pressure of more than 400 Pa, active species of deuterium are not likely to reach the substrate P, and as a result, the effect of removing water is seriously degraded.

In the process gas used in this embodiment, it is preferable that the concentration of deuterium be high and that the concentrations of hydrogen atoms (H) and water be low. As a particular hydrogen concentration, the concentration of $D_2$ is preferably 95 percent by volume or more.

Furthermore, the total concentration of $H_2$ and HD is preferably less than one percent by volume. In addition, the ratio of $H_2O$ to $D_2$ is preferably less than 0.1 percent by volume. Accordingly, the effect of using deuterium instead of hydrogen used in a conventional technique can be sufficiently obtained. Furthermore, the disturbance of water removal caused by moisture contained in the process gas can be suppressed.

In the plasma treatment of this embodiment, surface wave plasma is preferably used which is formed by microwaves. As such, high density plasma can be obtained, and high density deuterium active species can be supplied; hence, efficient water removal treatment can be performed. A microwave plasma apparatus capable of generating surface wave plasma as described above has been disclosed, for example, in Japanese Patent Laid-Open No. 11-40397, which was described above, Japanese Patent Laid-Open No. 2002-299241, and International Publication No. WO03/056622.

Next, the nitridation step used in the present invention will be described.

In the nitridation step of the preferable embodiment according to the present invention, the same treatment apparatus as that used in the surface treatment step described above may also be used.

As a nitrogen-based process gas used in the nitridation step, at least one gas selected from the group consisting of a nitrogen ($N_2$) gas, an ammonia ($NH_3$) gas, hydrazine ($H_2NNH_2$), and the like may be used. In addition, said at least one gas mentioned above may be mixed with a noble gas or a hydrogen gas to form a process gas.

The pressure inside the process chamber, the temperature of the object, the microwave electric power and the like in the nitridation step may be optionally determined in accordance with the pressure range and the temperature range in the above-described surface treatment step.

In addition, the process time may also be optionally determined in accordance with a necessary thickness of a nitride film.

As an object which is to be surface-treated in the present invention, for example, there may be used a metal, a semiconductor, and an insulating material, such as polycrystalline silicon, monocrystal silicon, amorphous silicon, metal silicide, strained silicon, silicon oxide, silicon carbide, and aluminum oxide, which have different crystal grain sizes.

In addition, the surface treatment step such as plasma-treatment using hydrogen, deuterium or the like and the following nitridation step may be performed continuously or intermittently in the same process chamber. Alternatively, it is also preferable that after the surface treatment step is performed in one of two process chambers, the object be transferred to the other chamber without being exposed to the air and be then processed by the nitridation treatment.

However, since the amount of moisture is small which is adsorbed on the object surface processed by moisture removal treatment in the surface treatment step, even when the object is once exposed to the air after the surface treatment step is performed with hydrogen or deuterium, an effect equivalent to that described above can be obtained by the nitridation step.

EXPERIMENTAL EXAMPLE 2

As the object, two types of monocrystal silicon wafers were prepared from wafers each provided with a native oxide film. That is, one type of wafer was prepared from a wafer provided with a native oxide film by surface treatment with deuterium plasma, followed by nitridation with nitrogen plasma. For preparing the other type of wafer, a wafer provided with a native oxide film was nitrided with nitrogen plasma without performing hydrogen plasma treatment and deuterium plasma treatment. As the plasma nitridation conditions, the microwave electrical power was 3 kW, the pressure was $2\times10^{-2}$ Pa, and the wafer temperature was 280° C.

Figure 3:
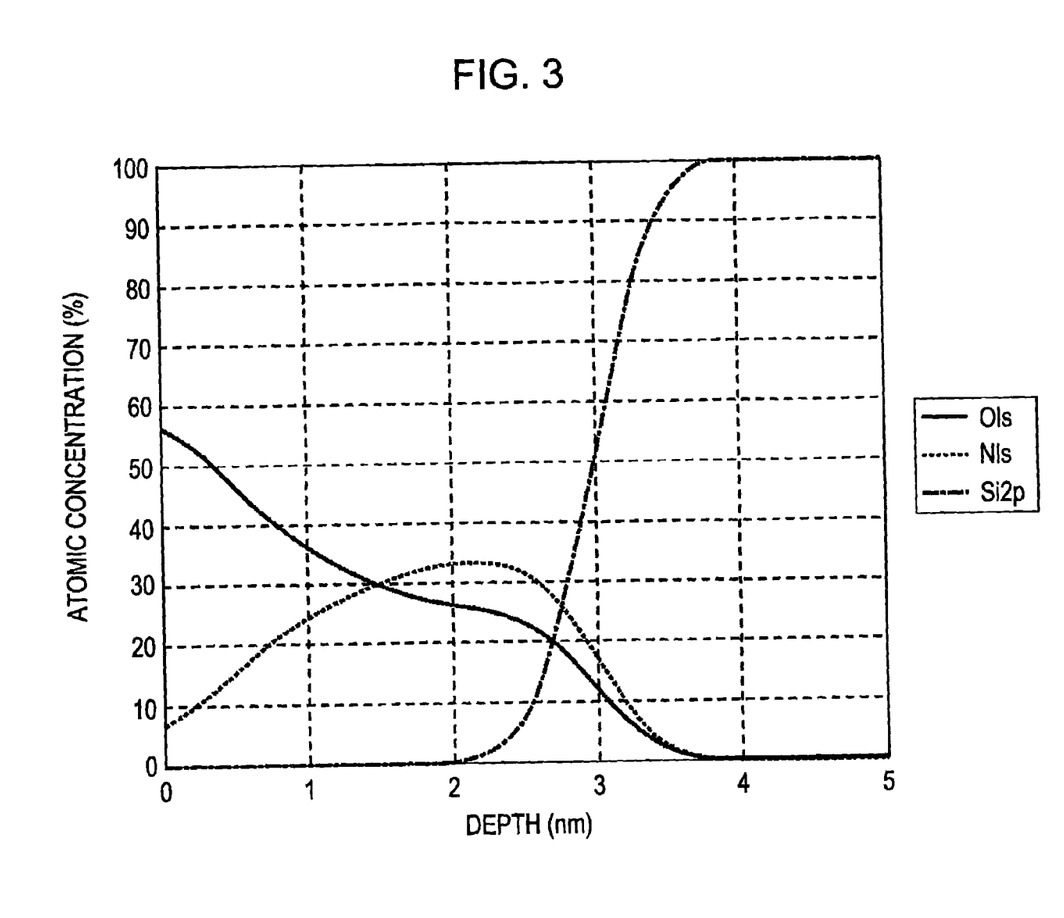
FIG. 3 is a graph showing the results of a secondary ion mass spectrometric analysis of a sample which is not processed by a surface treatment method according to the present invention.
Figure 4:
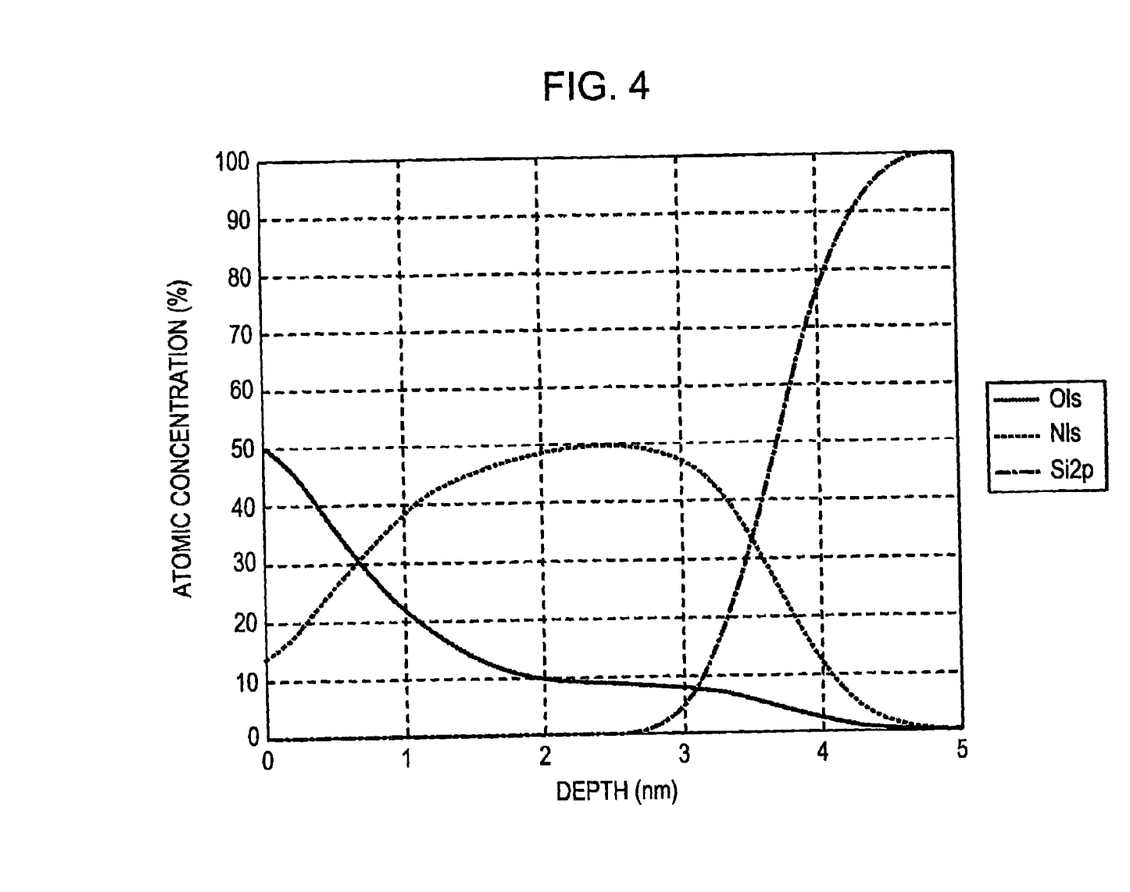
FIG. 4 is a graph showing the results of a secondary ion mass spectrometric analysis of a sample which is processed by a surface treatment method according to the present invention.

Those two types of samples were analyzed by secondary ion mass spectrometry (SIMS), and the results are shown in FIGS. 3 and 4.

According to a sample C2 which was not surface-treated with deuterium plasma, nitridation was performed while moisture was adsorbed on the native oxide film formed on the wafer surface as shown in FIG. 3. During plasma nitridation, moisture was dissociated by plasma, and oxidation of silicon was facilitated; hence oxygen was deeply diffused inside the wafer at a high concentration. As a result, since it was blocked by the oxygen, the nitrogen did not sufficiently enter the wafer.

On the other hand, according to a sample A2 which was surface-treated with deuterium plasma, because of the presence of the native oxide film, oxygen was diffused to the surface side to a certain extent as shown in FIG. 4. However, during plasma nitridation, no active species for facilitating oxidation was present except oxygen derived from the native oxide film. That is, it was understood that since oxygen derived from the adsorption water is not present, the oxygen concentration is low and the nitrogen sufficiently enters the wafer as compared to the case of the sample C2.

Hereinafter, a method for manufacturing a semiconductor device will be described which uses the above surface treatment method of the present invention.

According to this method, a necessary nitrogen concentration distribution can be obtained, and as a result, a semiconductor device having a superior-performance gate insulating film can be obtained.

EMBODIMENT 1

Embodiment 1 of the present invention relates to a method for manufacturing a semiconductor device, the method comprising the steps of performing surface treatment of surfaces of active regions made of monocrystalline silicon by hydrogen plasma, then performing nitridation treatment by nitrogen plasma, and subsequently forming a dielectric film having a high dielectric constant.

Figure 5A:
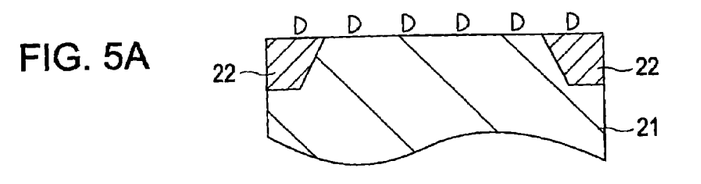
FIGS. 5A to 5E are schematic cross-sectional views for illustrating a method for manufacturing a semiconductor device of an embodiment according to the present invention.

On a surface of a p-type monocrystalline silicon wafer 21 used as an object, an element isolation region 22 and an active region surrounded thereby are formed by selective oxidation or shallow trench isolation.

Next, after a native oxide film on the active region surface is removed by hydrogen fluoride anhydride, washing is performed for several seconds with purified water, so that a monocrystalline silicon surface of the active region is terminated with fluorine.

Subsequently, the object is transferred into the apparatus shown in FIG. 1, and plasma is generated by introducing a deuterium gas and a hydrogen gas, so that the surface treatment for the monocrystalline silicon surface is performed.

Accordingly, as shown in FIG. 5A, the surface is terminated with deuterium, and hence a hydrophobic surface is obtained which is not likely to adsorb water.

Figure 5B:
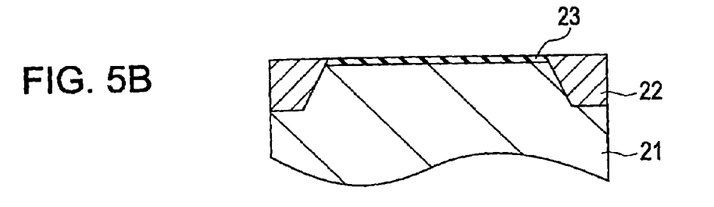

After the supply of a deuterium gas and that of a hydrogen gas are once stopped, and the process chamber is evacuated, plasma is generated by introducing a nitrogen gas, so that the monocrystalline silicon surface processed by the deuterium plasma is nitrided. As a result, as shown in FIG. 5B, a silicon nitride film 23 is formed.

Next, after the object is recovered from the apparatus shown in FIG. 1, washing and drying are performed, and by a sputtering method, a hafnium silicon oxynitride (HfSiON) film is formed as a dielectric film having a high dielectric constant.

On this dielectric film having a high dielectric constant, a polycrystalline silicon film is formed by a CVD method and is then patterned into a gate electrode by etching.

A dopant (donor such as arsenic or phosphorus in this case) having a conductivity opposite to that of the monocrystalline silicon substrate is ion-implanted, followed by heat treatment, so that source and drain regions containing a low concentration impurity are formed.

Figure 5C:
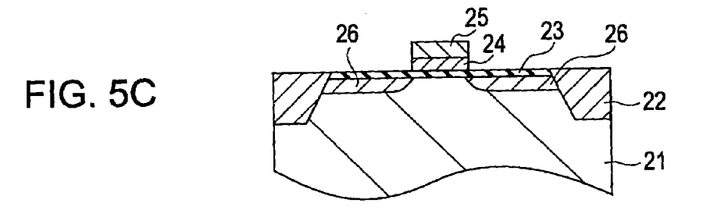

As described above, as shown in FIG. 5C, a gate dielectric film 24 made of a hafnium silicon oxynitride having a high dielectric constant is formed on the gate insulating film 23 made of silicon nitride, and on this dielectric film 24, a gate electrode 25 of polycrystalline silicon is formed. In addition, at two end portions of the gate electrode 25, source and drain regions 26 are formed which contain a low concentration impurity.

Then, after a silicon oxide film is formed by a CVD method, etch back is performed, so that dielectric sidewalls are formed on the sides of the polycrystalline silicon.

Again, after a dopant is ion-implanted, followed by heat treatment, a source and a drain region containing a high concentration impurity are formed.

Oxide films on the upper surfaces of the gate electrode, the source region, and the drain region, those two regions containing a high concentration impurity, are removed by a hydrofluoric acid, and a high melting point metal (refractory metal) such as Co or Ni is deposited by sputtering, followed by heat treatment. Subsequently, an unnecessary high melting point metal, which is not formed into a silicide, is removed by etching.

Figure 5D:
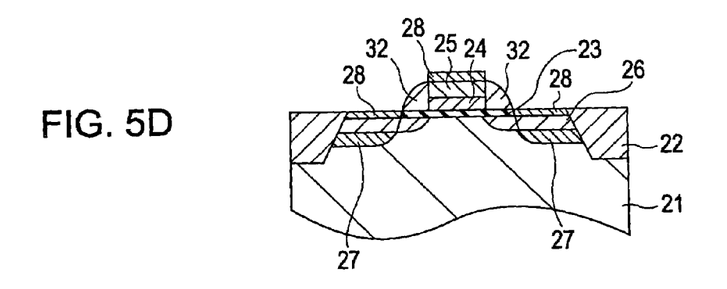

As described above, as shown in FIG. 5D, sidewalls 32 are formed at two end sides of the gate electrode 25, and at the end portions of the sidewalls 32, source and drain regions 27, which contain a high concentration impurity, are formed in a self-alignment manner. Subsequently, on the upper surfaces of the gate electrode 25 and the source and the drain regions 27, a high melting point metal silicide 28 is formed.

Figure 5E:
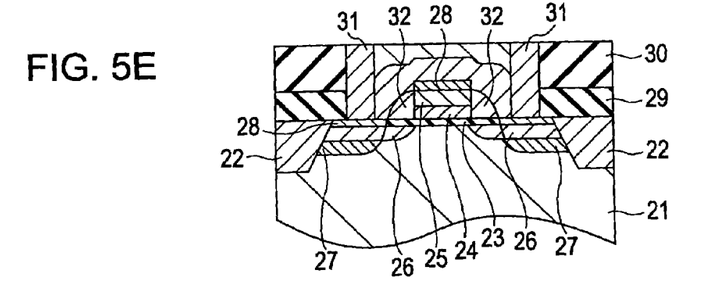

As shown in FIG. 5E, after an insulating film 29 made of silicon oxide containing boron and phosphorus is formed, and an insulating film 30 made of silicon oxide is further formed, contact holes are formed in the insulating films 29 and 30 so as to reach the source and the drain regions, and a metal 31 is then filled in the contact holes thus formed.

Accordingly, a MOS transistor as a semiconductor device is formed.

EMBODIMENT 2

Embodiment 2 of the present invention relates to a method for manufacturing a semiconductor device, comprising the steps of performing thermal oxidation of surfaces of active regions made of monocrystalline silicon, then performing surface treatment of the surfaces by using hydrogen plasma, then performing nitridation treatment by using nitrogen plasma, and subsequently forming a conductive film which is to be formed into gate electrodes.

Figure 6A:
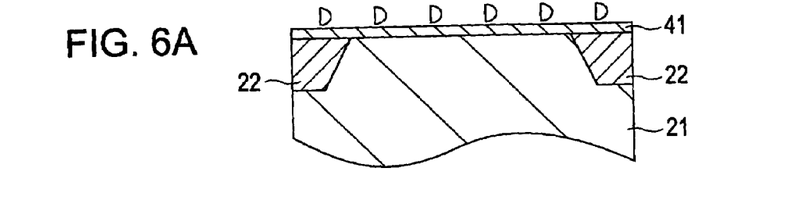
FIGS. 6A to 6E are schematic cross-sectional views for illustrating a method for manufacturing a semiconductor device of another embodiment according to the present invention.

On the surface of the p-type monocrystalline silicon wafer 21 used as an object, the element isolation region 22 and the active region surrounded thereby are formed by selective oxidation or shallow trench isolation.

Next, after a native oxide film on an active region surface is removed by hydrogen fluoride anhydride, washing is performed for several seconds with purified water, so that the monocrystalline silicon surface of the active region is terminated with fluorine.

A silicon oxide film is formed on the surface by thermal oxidation. Subsequently, the object is transferred into the apparatus shown in FIG. 1, and plasma is generated by introducing a deuterium gas and a hydrogen gas, so that the surface treatment is performed for the silicon oxide film on the monocrystalline silicon surface.

Accordingly, as shown in FIG. 6A, the surface is terminated with deuterium, and hence a silicon oxide film 41 is obtained having a hydrophobic surface which is not likely to adsorb water.

Figure 6B:
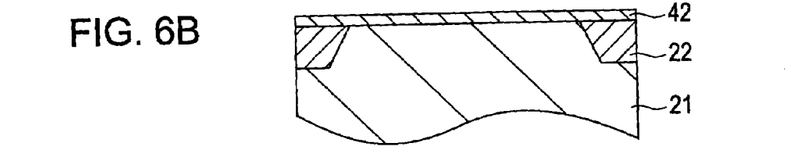

After the supply of a deuterium gas and that of a hydrogen gas are once stopped, and the process chamber is evacuated, plasma is generated by introducing a nitrogen gas, so that the surface of the silicon oxide film processed by the deuterium plasma is nitrided. As a result, as shown in FIG. 6B, a silicon oxide film 42 having a nitrided surface is formed. This silicon oxide film 42 has the following nitrogen and oxygen distributions, that is, the nitrogen content is high at the surface side and is gradually decreased along the depth direction, and the oxygen content is gradually decreased in the direction toward the surface.

Next, after the object is recovered from the apparatus shown in FIG. 1, washing and drying are performed, and by a sputtering method, a hafnium silicon oxynitride film is formed as a dielectric film having a high dielectric constant.

On this dielectric film having a high dielectric constant, a polycrystalline silicon film is formed by a CVD method and is then patterned into a gate electrode by etching.

A dopant having a conductivity opposite to that of the monocrystalline silicon substrate is ion-implanted, followed by heat treatment, so that source and drain regions containing a low concentration impurity are formed.

Figure 6C:
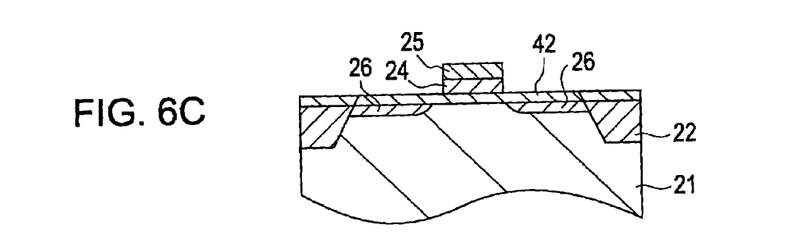

As described above, as shown in FIG. 6C, the dielectric film 24 of a hafnium silicon oxynitride having a high dielectric constant is formed on the gate insulating film 42 made of silicon oxide having a nitrided surface, and on this dielectric film 24, the gate electrode 25 of polycrystalline silicon is formed. Subsequently, the source and the drain regions 26, which contain a low concentration impurity, are formed in a self-alignment manner at two end portions of the gate electrode 25.

Then, after a silicon oxide film is formed by a CVD method, etch back is performed, so that dielectric sidewalls are formed on sides of the polycrystalline silicon.

Again, after a dopant is ion-implanted, followed by heat treatment, a source and a drain region containing a high concentration impurity are formed.

Oxide films on the upper surfaces of the gate electrode, the source region, the drain region, and the two regions containing a high concentration impurity, are removed by a hydrofluoric acid, and a high melting point metal (refractory metal) such as Co or Ni is deposited by sputtering, followed by heat treatment. Subsequently, an unnecessary high melting point metal, which is not formed into a silicide, is removed by etching.

Figure 6D:
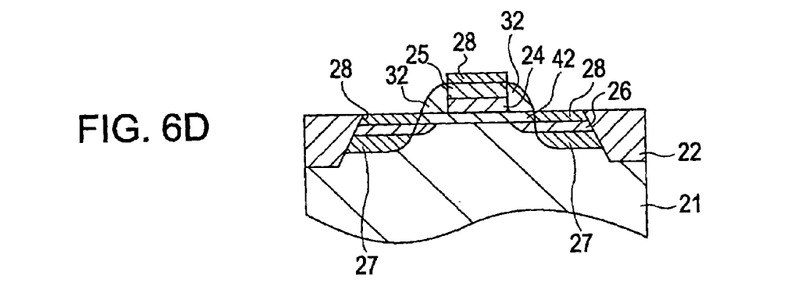

Accordingly, as shown in FIG. 6D, the sidewalls 32 are formed at two sides of the gate electrode 25, and at the end portions of the sidewalls 32, the source and drain regions 27, which contain a high concentration impurity, are formed in a self-alignment manner. Subsequently, on the upper surfaces of the gate electrode and the source and the drain regions 27, the high melting point metal silicide 28 is formed.

Figure 6E:
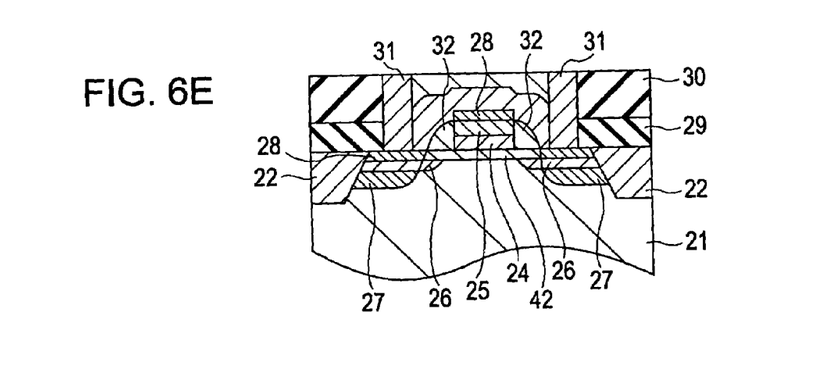

As shown in FIG. 6E, after the insulating film 29 made of silicon oxide containing boron and phosphorus is formed, and the insulating film 30 made of silicon oxide is further formed, contact holes are formed in the insulating films 29 and 30 so as to reach the source and the drain regions, and the metal 31 is then filled in the contact holes thus formed.

Accordingly, a MOS transistor as a semiconductor device is formed.

In this embodiment, when water adsorbed on or occluded in the object is replaced with hydrogen or deuterium, direct replacement is performed using plasma of the above process gas. However, instead of direct exposure to plasma, when a hydrogen gas or a deuterium gas is excited at a place apart from the chamber in which the object is received, and the process gas thus excited is then transported and is brought into contact with the surface of the object, an effect equivalent to that described above can be obtained.

Furthermore, in the present invention, when fluorine (F) is mixed with deuterium, the effect can be further improved.

EMBODIMENT 3

A method for manufacturing a capacitive element according to this embodiment will be described.

A conductive film made of polycrystalline silicon or a metal is formed on a substrate and is then patterned, so that a lower electrode is formed.

The surface of the lower electrode is exposed to an atmosphere containing at least one selected from the group consisting of hydrogen, deuterium, deuterated hydrogen, and tritium in a manner similar to that in Embodiments 1 and 2, so that surface treatment is performed.

In a manner similar to that in Embodiments 1 and 2, the surface of the lower electrode thus surface-treated is nitrided. Accordingly, an insulating film is formed by the nitridation.

A conductor made of polycrystalline silicon, a metal, a metal nitride, or a metal oxide is formed on the insulating film and is then patterned, so that an upper electrode is formed.

Accordingly, a capacitive element including the lower electrode, the nitrided insulating film, and the upper electrode can be obtained.

EMBODIMENT 4

This embodiment relates to a method for bonding two substrates, which is used as a method for manufacturing an SOI substrate.

Figure 7A:
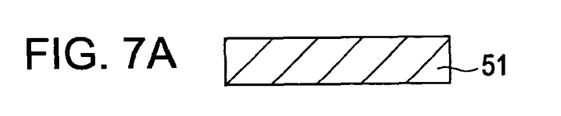
FIGS. 7A to 7E are schematic cross-sectional views for illustrating a method for manufacturing a semiconductor substrate of still another embodiment according to the present invention.

As shown in FIG. 7A, a substrate 51 made of monocrystalline silicon is prepared.

Figure 7B:
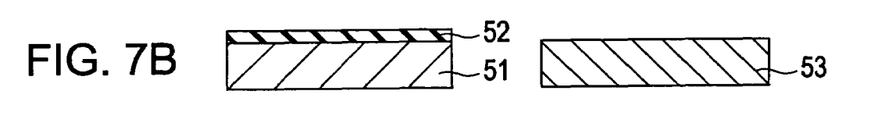

As shown in FIG. 7B, the surface of the substrate 51 is thermally oxidized, so that an insulating film 52 made of amorphous silicon is formed on the surface of the substrate 51. In addition, another substrate 53 made of monocrystalline silicon is also prepared.

The surface of the insulating film 52 of the substrate 51 and the surface of the substrate 53 are placed in an atmosphere containing deuterium, and plasma of deuterium is generated for surface treatment so as to enable the surface of the insulating film 52 of the substrate 51 and the surface of the substrate 53 to have hydrophobic properties.

Figure 7C:
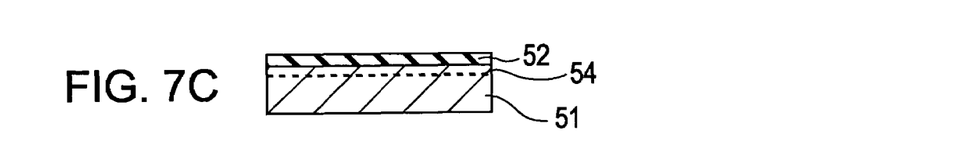

As shown in FIG. 7C, at least one type of ions, which is selected from the group consisting of hydrogen, deuterium, and a noble gas, is ion-implanted by an ion implanter, so that an ion-implanted layer 54 is formed inside the substrate 51. This ion-implanted layer functions as a separation layer in a subsequent step.

Next, whenever necessary, the insulating surface of the substrate shown in FIG. 7C is again exposed to deuterium plasma, so that hydrophobic treatment is performed.

Figure 7D:
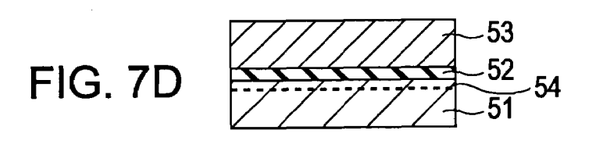

Next, as shown in FIG. 7D, the surfaces of the two substrates 51 and 53, which are processed by deuterium plasma to have hydrophobic properties, are tightly brought into contact with each other, followed by heat treatment, so that the two substrates are bonded to each other.

Figure 7E:
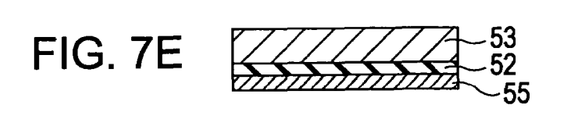

Subsequently, as shown in FIG. 7E, when heat treatment is further performed at a higher temperature, hydrogen present in the ion-implanted layer generates microbubbles, and the microbubbles grow along a plane parallel to the substrate surface, so that the substrate 51 is separated. Accordingly, a monocrystalline silicon layer 55, which is a remaining part of the substrate 51 thus separated, is formed on the insulating film 52 bonded to the substrate 53, and hence an SOI substrate is obtained.

Heretofore, when bonding is performed, moisture adsorbed on the surfaces of the two substrates has an adverse influence. That is, the moisture is turned into water vapor after bonding and is simultaneously expanded, and as a result, bonding defects (voids) might be generated in some cases. Accordingly, before bonding, the surfaces of the two substrates are processed by plasma in an atmosphere containing deuterium as described above. As described above, absorption water on the surfaces of the two substrates to be bonded to each other are removed, and in addition, the surfaces thereof are turned into hydrophobic surfaces which are unlikely to adsorb moisture. As a result, since absorption moisture on the surfaces of the two substrates can be removed, a good quality SOI substrate can be manufactured which generates no voids after bonding.

The method for forming an SOI substrate is not limited to a method which forms an ion-implanted layer beforehand inside a substrate by ion implantation using one type of ions selected from the group consisting of hydrogen and a noble gas. In addition, the bonding method described above is not limited to a method for manufacturing an SOI substrate and may also be applied to a manufacturing method of microelectromechanical systems (MEMS).

When the surface treatment method of the present invention is applied to the MEMS manufacturing method, as substrates to be bonded together, for example, there may be mentioned two silicon substrates or silicon substrates having thermal-oxidized films on surfaces thereof to be bonded together.

In addition, the substrate is not limited to silicon, and for example, a compound semiconductor such as a III-V semiconductor or a metal may also be used.

EMBODIMENT 5

This embodiment relates to surface treatment of an ink discharge surface (orifice surface) of an inkjet device.

Figure 8A:
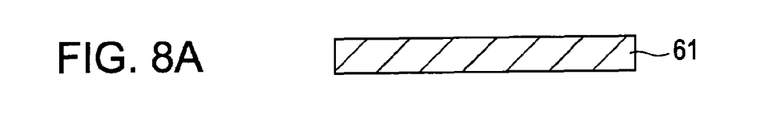
FIGS. 8A to 8C are schematic cross-sectional views for illustrating a method for manufacturing an inkjet head of another embodiment according to the present invention.

As shown in FIG. 8A, a substrate 61 made of a metal or silicon is prepared.

Figure 8B:
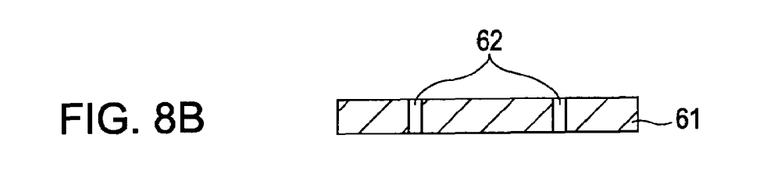

As shown in FIG. 8B, by wet etching or by dry etching, openings 62 to be used as an ink discharge port are formed in the substrate 61.

Next, the silicon substrate having ink discharge ports formed therein is processed by plasma in an atmosphere containing deuterium. Accordingly, since having improved hydrophobic properties, that is, improved water-repellent properties, the silicon substrate thus processed is preferably used as an orifice plate of an inkjet head.

Figure 8C:
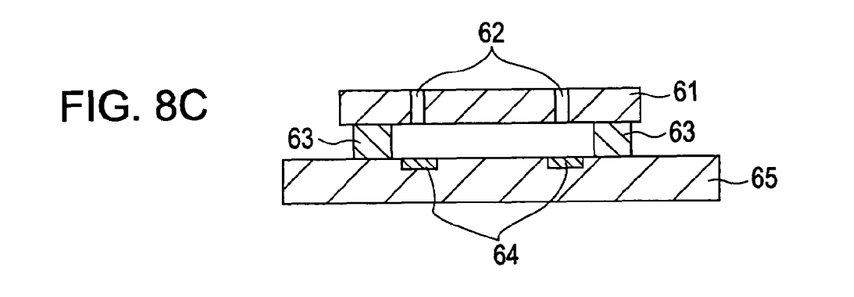

In addition, a substrate 65 having a heating resistor 64 used as an electrothermal conversion member is prepared, and on the surface of the substrate 65, sidewalls 63 obtained by patterning of a photosensitive resin are formed.

Subsequently, as shown in FIG. 8C, the substrate 61, that is, the orifice plate processed by hydrophobic treatment, is bonded to the sidewalls 63, thereby forming an inkjet head.

After the treatment of this embodiment is performed, various steps for film treatment and new film formation by plasma nitridation, plasma oxidation or the like may be further performed.

According to the several embodiments of the present invention, even when a substrate surface, that is, a surface of an object, which is processed by moisture removal treatment to have hydrophobic properties, is exposed to a clean-room atmosphere for a long period of time, the amount of moisture adsorbed on the surface is small as compared to that in a conventional technique. Hence, the degree of freedom of manufacturing semiconductor devices can be increased.

In the present invention, of course, the $D_2$ plasma treatment is also very effective to remove surface adsorption moisture on substrates of electronic devices besides semiconductor devices and to replace the surface adsorption moisture with $D_2$. For example, the present invention is effectively used when surface adsorption water is removed by the $D_2$ plasma treatment performed on one substrate selected from the group consisting of a quartz substrate, a sapphire substrate, a silicon carbide (SiC) substrate, a glass substrate, a piezoelectric substrate, and a ceramic substrate so as to replace the surface adsorption water with $D_2$.

In the above-described embodiments according to the present invention, the description was made by primarily using deuterium ($D_2$, HD, $H_3$) by way of example; however, when fluorine is added to the above deuterium, the effect can also be further improved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-043967 filed Feb. 21, 2006 and Japanese Application No. 2005-235096 filed Aug. 12, 2005, which are hereby incorporated by reference herein in their entirety.

What is claimed is:

1. A surface treatment method comprising:
    a surface treatment step of exposing a surface of an object to plasma which is generated in an atmosphere containing at least one selected from the group consisting of deuterium, deuterated hydrogen, and tritium, wherein the surface treatment step is performed at a process pressure in the range of 50 Pa to 400 Pa; and
    a nitridation step of nitriding the surface of the object by generating plasma in an atmosphere containing nitrogen after the surface treatment step.

2. The surface treatment method according to claim 1, wherein a temperature of the object in the surface treatment step is in the range of 180 to 400° C.

3. The surface treatment method according to claim 1, wherein the atmosphere in the surface treatment step contains deuterium at a concentration of 95 percent by volume or more.

4. The surface treatment method according to claim 3, wherein the total concentration of $H_2$ and HD in the atmosphere in the surface treatment step is less than one percent by volume.

5. The surface treatment method according to claim 3, wherein the ratio of $H_2O$ to deuterium in the atmosphere in the surface treatment step is less than 0.1 percent by volume.

6. A method for manufacturing a semiconductor device, comprising:
- a surface treatment step of exposing a surface of a semiconductor substrate to plasma which is generated in an atmosphere containing at least one selected from the group consisting of deuterium, deuterated hydrogen, and tritium, wherein the surface treatment step is performed at a process pressure in the range of 50 Pa to 400 Pa;
- a step of forming a gate insulating film after the surface treatment step, which comprises a nitridation substep of nitriding the surface of the semiconductor substrate by generating plasma in an atmosphere containing nitrogen; and
- a step of forming a gate electrode on the gate insulating film.

7. The method for manufacturing a semiconductor device, according to claim 6,
wherein the step of forming a gate insulating film further comprises a substep of forming one of a metal oxide, a metal nitride, and a metal oxynitride after the nitridation substep.

8. The method for manufacturing a semiconductor device, according to claim 6,
wherein the step of forming a gate insulating film further comprises a substep of forming a metal oxide before the surface treatment step.

9. The method for manufacturing a semiconductor device, according to claim 6,
wherein the step of forming a gate insulating film further comprises a substep of forming a metal oxide, the surface treatment step is performed after the substep of forming a metal oxide, and subsequent to the surface treatment step, the nitridation substep is performed without exposing the semiconductor substrate to the atmosphere containing at least one of deuterium, deuterated hydrogen, and tritium.

10. A method for manufacturing a capacitive element, comprising:
- a surface treatment step of exposing a surface of a lower electrode to plasma which is generated in an atmosphere containing at least one selected from the group consisting of deuterium, deuterated hydrogen, and tritium, wherein the surface treatment step is performed at a process pressure in the range of 50 Pa to 400 Pa;
- a nitridation step of nitriding the surface of the lower electrode by generating plasma in an atmosphere containing nitrogen after the surface treatment step to form an insulating film; and
- a step of forming an upper electrode on the insulating film.

11. A capacitive element manufactured by the method according to claim 10.

12. A surface treatment method according to claim 1, wherein the atmosphere in the surface treatment step further contains fluorine.

* * * * *